US008949095B2

(12) United States Patent
Lopez et al.

(10) Patent No.: US 8,949,095 B2
(45) Date of Patent: Feb. 3, 2015

(54) GRID ARCHITECTURE FOR POWERTRAIN PACKAGING

(75) Inventors: Rodney L. Lopez, Dearborn, MI (US); Deepak B. Chhaya, Novi, MI (US); Michael A. Scheuer, Dearborn, MI (US); Chris P. Roxin, West Bloomfield, MI (US); John A. Norcutt, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 493 days.

(21) Appl. No.: 13/362,119

(22) Filed: Jan. 31, 2012

(65) Prior Publication Data

US 2013/0197867 A1  Aug. 1, 2013

(51) Int. Cl.
*G06G 7/48* (2006.01)

(52) U.S. Cl.
USPC ........ 703/8; 703/1; 703/7; 180/271; 180/273; 180/274; 180/268; 280/735; 701/538; 701/2; 701/36; 701/51; 701/45; 310/319; 310/90; 310/71

(58) Field of Classification Search
None
See application file for complete search history.

(56) References Cited

U.S. PATENT DOCUMENTS

| 4,850,878 | A | 7/1989 | Perotti |
| 5,203,073 | A | 4/1993 | Kotake |
| 7,269,900 | B2 | 9/2007 | Moriya |
| 2003/0080271 | A1 | 5/2003 | Haves |
| 2005/0039024 | A1 | 2/2005 | Stemm |
| 2010/0114519 | A1 | 5/2010 | Hollingshead |

OTHER PUBLICATIONS

Tyson Browning Applying the Design Structure Matrix to System Decomposition and Integration Problems: A Review and New directions IEEE Transactions on Engineering Management, vol. 48, No. 3, Aug. 2001.*

* cited by examiner

*Primary Examiner* — Omar Fernandez Rivas
*Assistant Examiner* — Cuong Luu
(74) *Attorney, Agent, or Firm* — Damian Porcari; MacMillan, Sobanski & Todd, LLC (57) ABSTRACT

A method to improve design efficiency by reducing power plant complexity and engineering costs by minimizing power plant changes when installing into new powertrain groups. A three-dimensional grid is defined for the powertrain group with power plant and transmission zones to define projections for attaching selected components to a powertrain version. The zones correspond to matrices dividing each of a width, length, and height of a respective plant and of a transmission into specified proportions. A respective zone is designated for attaching each of the selected components within the group. Each powertrain version is designed to place each selected component for a powertrain version within a predetermined tolerance margin of its respective designated zone. The grid organization is also applied to placement of components and placement of the powertrain itself within the underhood environment of a vehicle, a vehicle platform, or a group of vehicle models.

19 Claims, 9 Drawing Sheets

GRID ARCHITECTURE FOR POWERTRAIN PACKAGING

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to the design and assembly of transportation vehicles and powertrains, and, more specifically, to a method of coordinating the design of various powertrains to improve efficiency, reduce complexity, increase commonality of components, and simplify the resulting assembly operations.

A typical original equipment manufacturer (OEM) of transportation vehicles offers a full line of vehicles including cars, sport utility vehicles, trucks, and vans. A platform may be developed as a basic underlying structure to be shared by several vehicle lines. Each line itself comes in a variety of models which may change each year and which are offered with various options.

The assembly process for transportation vehicles is a very complex series of highly engineered operations. Assembly facilities and equipment represent a very large investment and have significant operating costs. Due to variations in vehicle models and the optional features, the assembly infrastructure must be configured to handle the operations involved in assembling each variant or model.

Similarly, the efforts to design and develop a vehicle and all of its component parts is a complex and expensive undertaking. Each separate model has its own unique requirements and specifications which must be used to guide the design efforts.

Each vehicle model has some particular type of a powertrain (i.e., a power plant and transmission) for converting an energy source (e.g., gasoline from a fuel tank or electricity from a battery) into motion to be applied to the vehicle wheels. During assembly, the power plant (i.e., a combustion engine and/or an electric motor) and the transmission, which arrive at the assembly plant preassembled, are mounted to a vehicle frame. Other components are then attached to the powertrain such as an engine manifold, oil cooler, starter motor, air conditioning compressor, driveshaft, electrical harness pigtails, and many other components depending on the particular model. Due to the wide design variations in engines, motors, and transmissions, assembly operations for these other components vary significantly from model to model. Components that interface to the powertrain may be similar across different vehicle models (e.g., a coolant hose or a fuel line) but each may require separate design and validation efforts because the different powertrains that they attach to have different layouts.

SUMMARY OF THE INVENTION

The present invention reduces the complexity and cost of vehicle assembly operations by specifying consistent locations where various selected components will assemble onto a powertrain. Consequently, less design variation and reconfiguration are necessitated for the assembly facilities and equipment. The invention reduces overall manufacturing costs and improves packaging (i.e., design engineering) efficiency across power plants.

In one aspect of the invention, a method is provided for coordinating vehicle assembly operations for a powertrain group. The powertrain group includes a plurality of powertrain versions, and each powertrain version includes a respective power plant and a respective transmission. The method is comprised of defining a three-dimensional grid corresponding to the powertrain group having a plurality of power plant zones and a plurality of transmission zones. The power plant and transmission zones define projections for attaching selected components to a powertrain version. The power plant zones correspond to a first matrix dividing each of a width, length, and height of a respective power plant into a first fixed proportion (e.g., thirds). The transmission zones correspond to a second matrix dividing each of a width and height of a respective transmission into the first fixed proportion and a length of the respective transmission into a second fixed proportion (e.g., halves). A respective zone is designated for attaching each of the selected components within all the respective power plants and respective transmissions of the powertrain group. Each of the powertrain versions is then designed with a placement of each selected component used in the powertrain version within a predetermined tolerance margin of its respective designated zone.

DETAILED DESCRIPTION OF PREFERRED EMBODIMENTS

Figure 1:
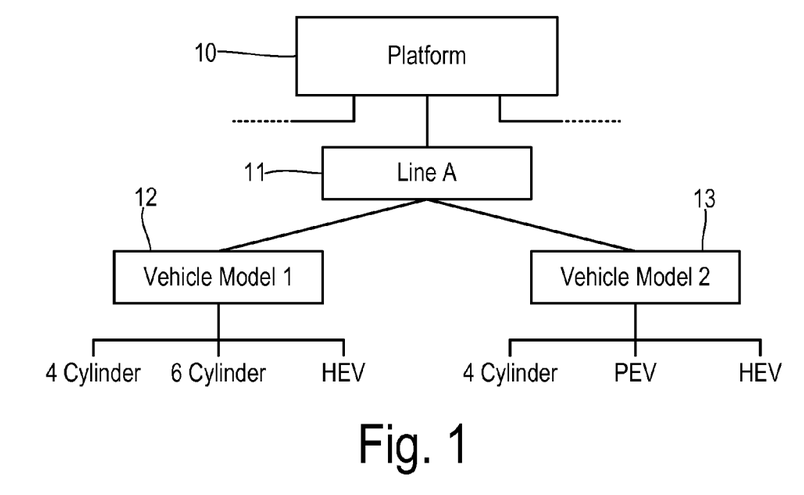
FIG. 1 is a diagram showing the relationship between various vehicle models that may be grouped together.

Referring to FIG. 1, a full vehicle lineup from a particular manufacturer may include a plurality of platforms including a first platform 10 on which various models are based. A first vehicle Line A included under platform 10 is shown in box 11. Line A may correspond to a particular cross-over vehicle such as a Ford Flex, for example. In a particular model year for Line A, specific vehicle models 1 and 2 shown in boxes 12 and 13 are offered. Models 1 and 2 may correspond to a base model and a more fully featured or "Limited" model. Each model may further include different optional powertrains such as a four cylinder engine, a six cylinder engine, a hybrid electric vehicle (HEV), or a plug-in electric vehicle (PEV). Other powertrain options may include different versions of a transmission including a front wheel drive transmission and an all wheel drive transmission.

The various models utilize many of the same kinds of component parts for interfacing with the powertrain, such as heater hoses, fuel lines, air conditioning fluid lines, electrical wiring pigtails, and others. Because of the use of different powertrains and their unique packaging requirements, each component is usually re-engineered for each model. Thus, significant time and money may be spent for engineering design, verification, and qualification of a component (instead of using an already qualified design) because its packaging space (e.g., its length and shape) is unlike any previous vehicle model. If powertrains are designed in a consistent manner so that the packaging constraints inherent in the designs had less variation, re-engineering of the same component is minimized.

All the various models within a particular line may typically be assembled in the same assembly plant along the same assembly lines. Depending on the different designs of the variants being produced for the engine, prior art assembly operations to add an air conditioning compressor may be very different between the various vehicle models being built on a single assembly line. By commonizing the region in which any particular component such as an air conditioning compressor is to be placed on the powertrain, cost savings can also be realized in the assembly process. Similar savings are obtained by extending the commonality beyond a single vehicle line (e.g., to a platform or to all the vehicles or powertrains of a particular manufacturer).

The present invention employs a strategy that positions key architecture and assembly points onto the structural elements of a particular powertrain based on a grid. The powertrain (also known as a powerpack) includes an engine, a transmission, and optionally a transfer case as shipped to the vehicle assembly plant. The "global architecture packaging" of the present invention is not intended to design any powertrain hardware or other components, only to specify where such hardware and components need to be located in order to improve the "bill of process" and the overall packaging and assembly operations between the powertrain variants that fall into a particular group.

Figure 2:
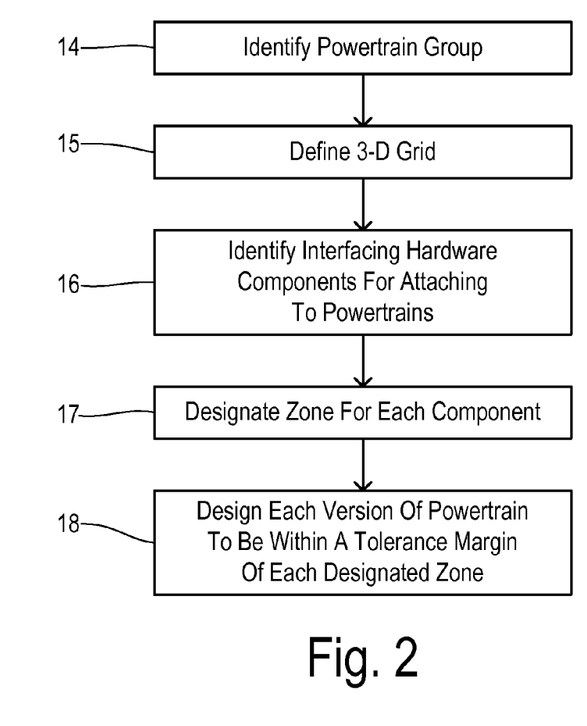
FIG. 2 is a flowchart showing a preferred embodiment of a method of the present invention.

One preferred embodiment of the invention is shown in FIG. 2. In step 14, a powertrain group is identified. The group may include all the variants of a certain type of engine such as in-line 4-cylinder engines, V-6 engines, or a range of related engines such as Ford Duratec engines, for example. A group may be intended to share elements of their assembly operations, such as when the group members are all part of a common platform, are similar models, or are to be assembled at the same or related facilities. For a particular powertrain group, a three-dimensional grid is defined in step 15. In step 16, all the hardware components that may need to be attached to the powertrain versions within the group are identified. In step 17, a zone is designated for each identified component. In step 18, each version of the individual powertrain is designed subject to the constraint that it must place each interfacing component within a tolerance margin of each designated zone. Such placements result in more commonized assembly operations and facilitate efficient design and packaging of the interfacing components. In the event that a particular design issue arises during design of a powertrain which necessitates placement of a particular component outside of the tolerance margin for the designated zone, a formal deviation process must be employed in which a team responsible for designing a particular powertrain will obtain approval for non-compliance from an authorizing group within the Design & Manufacturer's organization.

The layout of a preferred grid employed in the present invention is illustrated in FIGS. 3-7. In general, the width of the grid is partitioned into equal thirds to indicate a right, center, and left portion that extends over the engine, transmission, and transfer case (if one is attached to the rear end of the transmission case). The length corresponding to the power plant (i.e., engine or electric motor) is partitioned into equal thirds to indicate front, center, and rear. The transmission is partitioned lengthwise into equal halves. The height of the grid is partitioned into equal thirds defining a top, middle, and bottom. The boundaries or edges for dividing the width and height of the grid are determined by the overall dimensions of the engine/power plant separately, so that the corresponding zones extend unchanged onto the transmission section. Based on its typical arrangement, the transmission is located vertically in the middle and bottom levels. In the event that a power transfer unit (PTU) is being employed, it is typically close enough to the engine to be considered to fall in the zones defined for the engine. Instead of thirds and halves, the power plant and transmission could be partitioned according to other fixed proportions.

Figure 3:
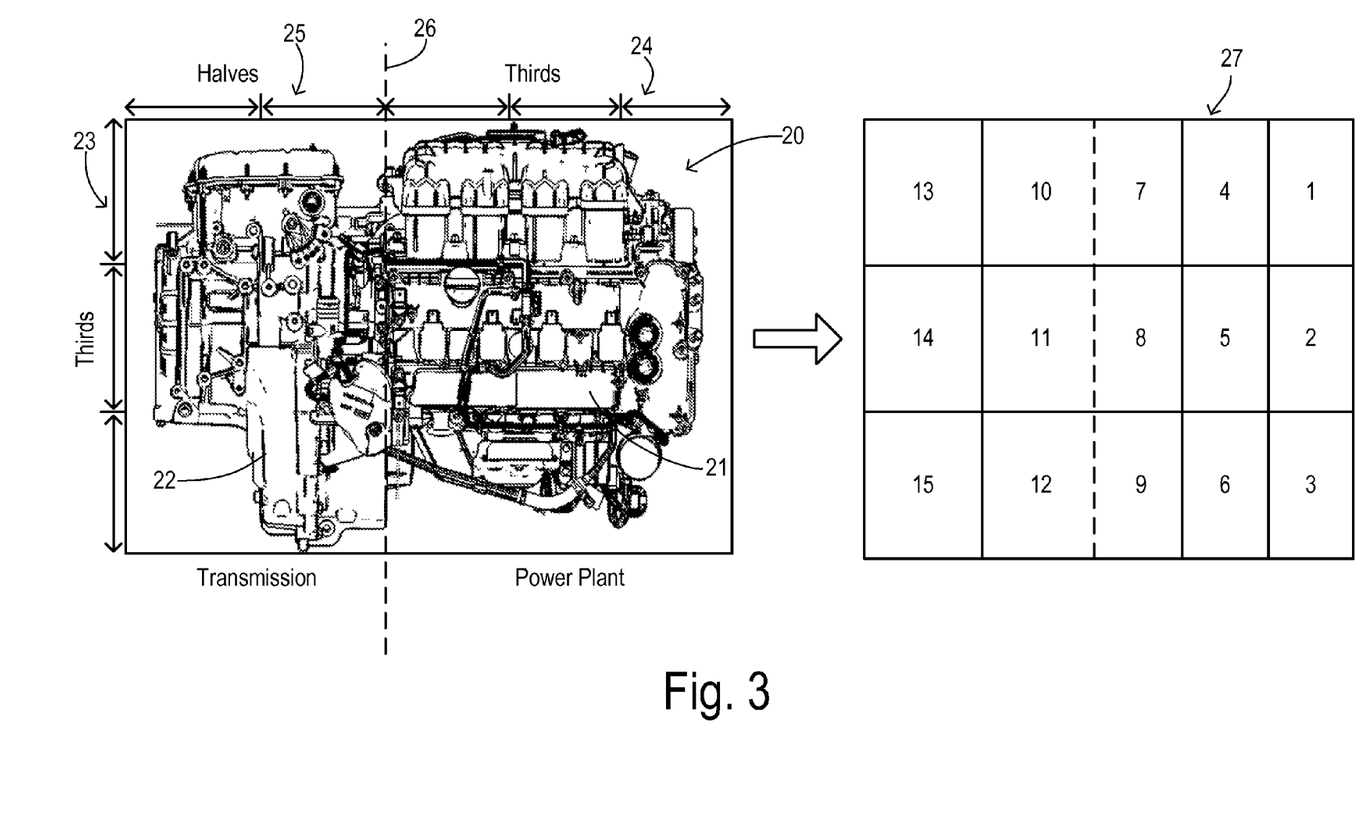
FIG. 3 illustrates a top view of a powertrain and a grid of the present invention identifying zones for being mapped to receive various interfacing components.
Figure 4:
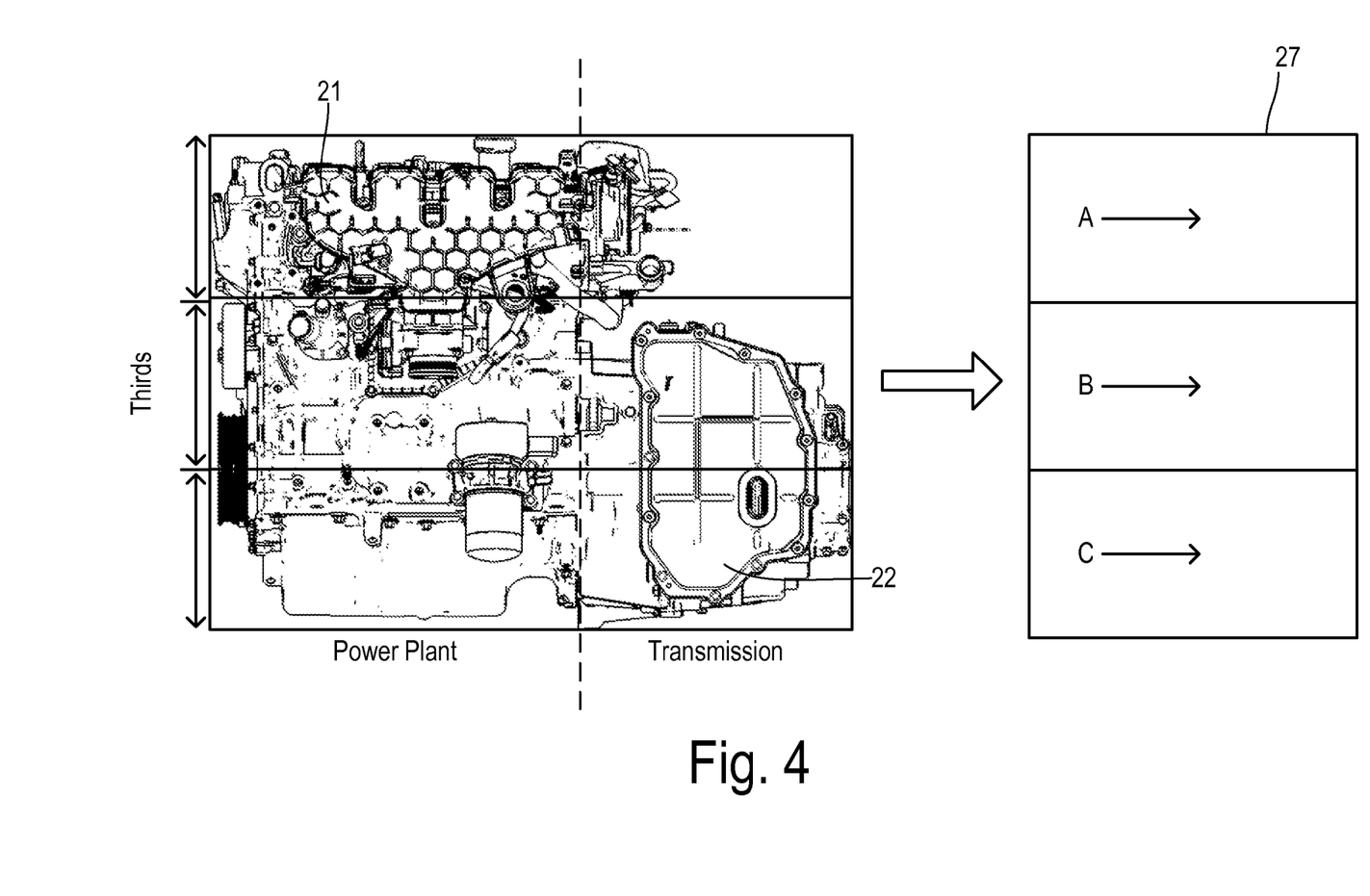
FIG. 4 illustrates a side view of the powertrain and the grid of FIG. 3.

Referring to FIG. 3, a powertrain 20 includes a power plant 21 and a transmission 22. The width of powertrain 20 is divided into equal thirds 23 extending the full length of power plant 21 and transmission 22. The length of power plant 21 is divided into equal thirds 24 between a front of plant 21 and a back edge 26. The length of transmission 22 from edge 26 to the back of a transmission case is divided into equal halves 25. Respective zones may be identified according to a numbering scheme as shown by a matrix 27 that can be overlaid on powertrain 20. In particular, a first matrix for dividing the width, length, and height of plant 21 defines power plant zones 1-9. The numbering progresses from the left side of the plant to the right, and from the front to the rear. A second matrix divides the width and height of the transmission into thirds and the length of transmission 22 into halves, such that the second matrix designates zones 10-15 sequentially from the left side to the right side and from the front to the back of transmission 22. FIG. 4 is a left side view of power plant 21 and transmission 22 illustrating the equal partitioning of the height into levels A, B, and C of grid 27.

Figure 5:
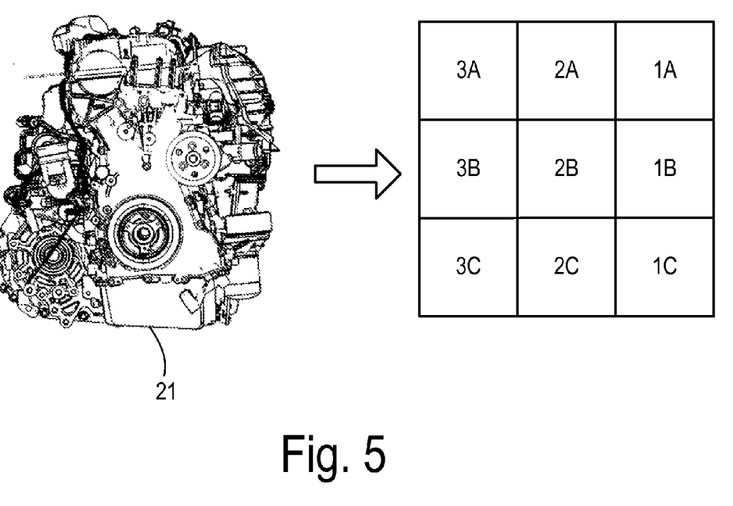
FIGS. 5-7 illustrate front, back, and perspective views of the grid, respectively.
Figure 6:
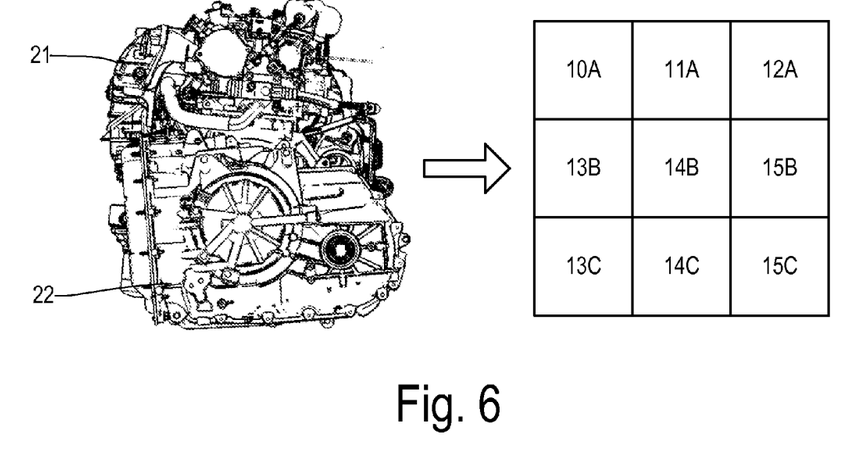

By combining the number and letter designations, a front face of plant 21 is divided into respective power plant zones 1A through 3C as shown in FIG. 5. FIG. 6 shows a rear view of the powertrain. Since transmission 22 does not extend into height level A, the projection zones actually visible in FIG. 6 include power plant zones 10A, 11A, and 12A together with transmission zones 13B-15C.

Figure 7:
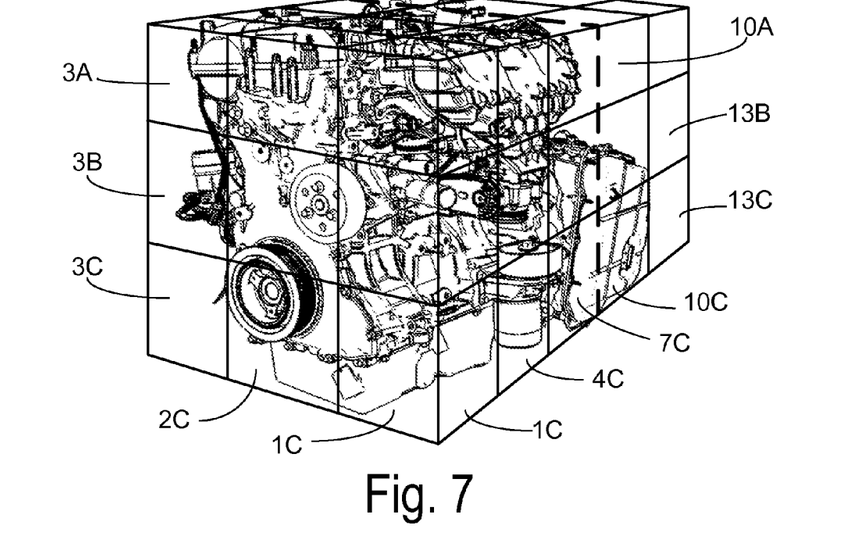

FIG. 7 shows a perspective view of the three-dimensional grid overlaying the powertrain. Although not always present, the power plant section typically includes a front end accessory drive (FEAD) at its front end. In particular, an internal combustion engine may typically include an FEAD with a pulley. The first matrix for defining the grid covering the plant section preferably has a front edge coinciding with a rear face of the pulley. The internal combustion engine contains an engine block. The back edge of the first matrix is selected to coincide with a rear face of the engine block. Based on the designated front and back edges, the length is divided into equal thirds. The second matrix for defining the grid over the transmission section typically extends from the rear face of the engine block to the rear end of the transmission case.

By locating the front edge of the power plant section to coincide with the rear face of the crank pulley (or of a crank damper in systems without pulleys), the invention provides stability for the grid across a variety of engines that may use different pulley systems with different overall thicknesses. For a power plant without an FEAD or damper, the front edge of the first matrix may coincide with an engine front cover.

The side edges for the matrix defining the grid are located based on the type of engine or motor. For example, the side edges for a V-engine are defined as the outermost portion of the valve cover structural elements. Thus, brackets or hoses located on the valve cover or any integrated manifold extending from the engine heads are not used in defining the side edge. In the case of an in-line engine, the width of the grid (i.e., the edges of the first and second matrices) is defined to be twice the maximum width of the interface between the engine block and engine head, and the grid width is centered on the centerline of the engine crank. By defining the grid edges in this way, any integrated manifolds or PIA water-to-air coolers that may be present cannot result in moving the grid away from being centered with the central line of the engine crank. By doubling the width of the block/head interface, the grid is ensured to be large enough to capture the core design of the engine/power plant.

A dashed line in FIG. 3 separating the first matrix from the second matrix between the rear face of the engine block and the front face of the transmission represents the fact that the lengthwise zones on either side of the dashed line have different length due to the fact that the transmission length divided in half is likely to be different than the engine length divided by three. The top of the grid preferably coincides with an upper structural element of the intake or exhaust manifold or the valve cover. The bottom of the grid may preferably coincide with the bottom of an oil pan. The foregoing strategy provides the most overall consistency of the grid since any particular plant or transmission may be used in combinations with other engines or other transmissions in different powertrains.

Figure 8:
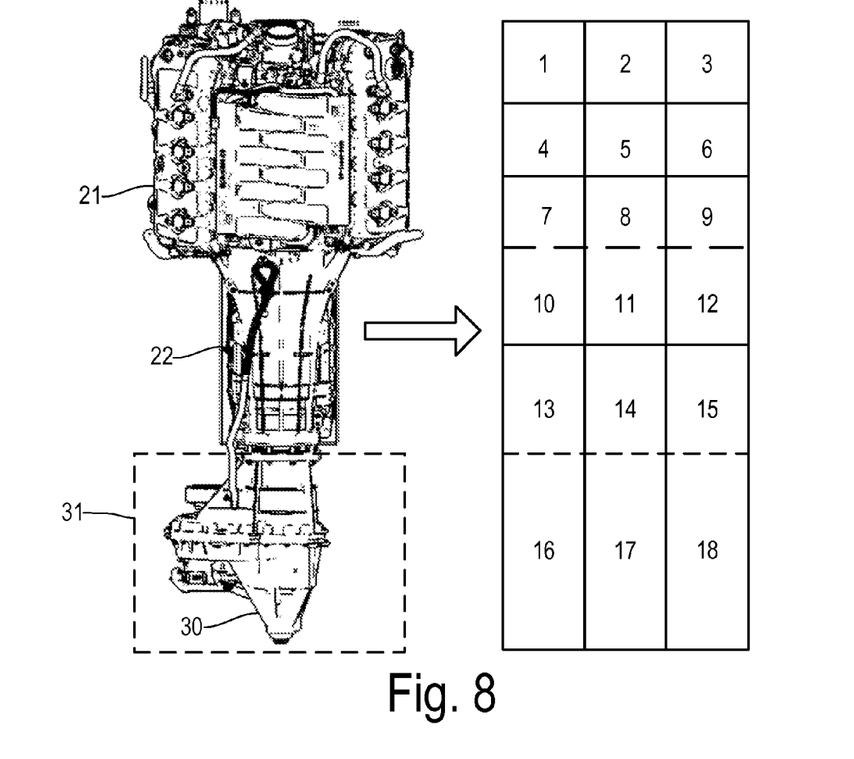
FIG. 8 illustrates a top view of a powertrain with a transfer case and added zones for the transfer case.

FIG. 8 shows an extended grid wherein a transfer case 30 is present at the rear end of transmission 22. A transfer-case zone 31 has its width and height divided into thirds (as defined by extending the grid from engine 21) and with the length of transfer case 30 being undivided. Numbering of the transfer-case zones may follow the numbering of transmission zone 15, thereby resulting in transfer-case zones 16, 17, and 18.

Figure 9:
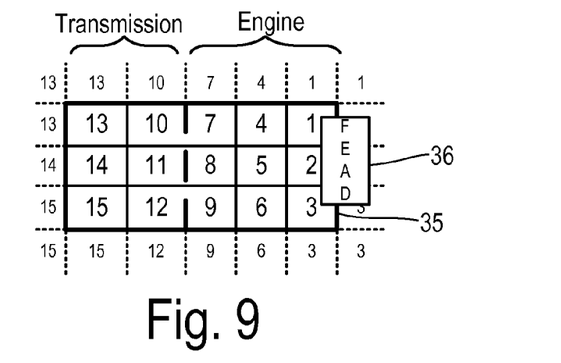
FIG. 9 illustrates a top view of the grid with projections for an East-West orientation of a powertrain (as used in a typical front wheel drive vehicle).
Figure 10:
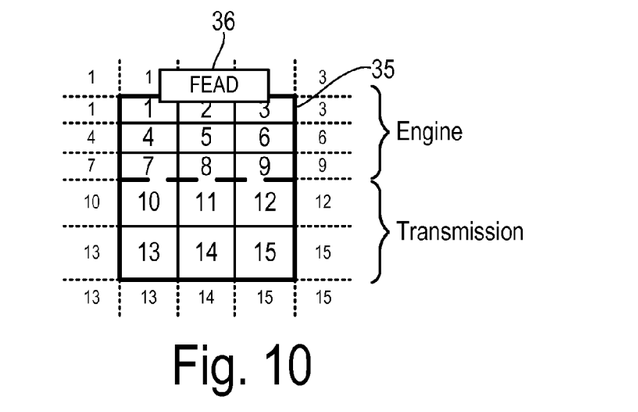
FIG. 10 illustrates a top view of the grid with projections for a North-South orientation of a powertrain (as used in a typical rear wheel drive vehicle). It can be seen that the zone numbering scheme rotates with the power plant.

As shown in FIG. 9, the grid and resulting zones define projections extending outwardly from the grid wherein each projection defines a location for attaching selected components to the powertrain. Thus, a grid 35 may have a front FEAD (Front End Accessory Drive) tag 36 at the front end with zones being numbered 1-15 as shown. Each projection zone extending outwardly from the grid carries the matching number designation. FIG. 9 represents a front wheel drive system wherein the powertrain is mounted transverse to the front-back direction of the vehicle. FEAD tag 36 is maintained at the front of the engine even though this may not correspond to the front of the vehicle. FIG. 10 depicts a rear wheel drive orientation wherein FEAD tag 36 coincides with the front of the vehicle.

Figure 11:
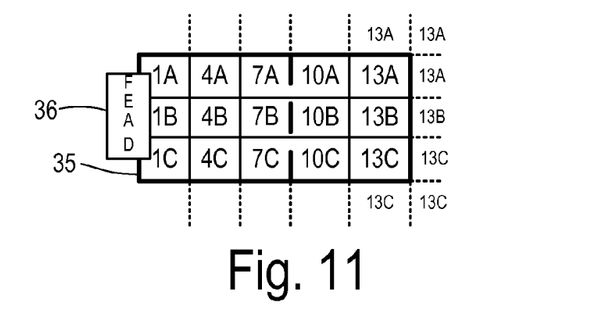
FIG. 11 illustrates a side view of the grid with projections.

FIG. 11 illustrates the projections from various zones in a side view. It will be noted that zones at a corner or edge of the grid may include the projection extending in more than one direction. For example, zone 13A has a projection extending to the side, to the rear, and upwardly such that a component assigned to attaching at zone 13A can be attached from any of the projecting directions.

Based on the projections identified by the zones, a hardware component to be assembled onto the powertrain does so at a particular zone. The present invention identifies components that may potentially be utilized in a powertrain design and designates an appropriate zone for its attachment. Thus, when all the expected features for a particular powertrain group are considered, a listing would be compiled of most or all components that may be necessary—and the general needs of each component are considered in order to identify the best location. Components that may reside on or attach to the power plant (e.g., engine or motor) include but are not limited to intake and exhaust manifolds, a turbo charger, an engine mount, an oil filter, an oil cooler, an oil fill cap, an oil dip stick, a throttle body, a starter motor, an FEAD pulley, an alternator, an EGR valve, a fuel pump, a vacuum pump, an air induction system, and an electrical harness such as is connected to a powertrain controller and/or various sensors or actuators. Additional components could include an air-conditioning compressor, a radiator hose coupling (i.e., pierce points), and a heater hose coupling. Selected components that interface with a transmission include a transmission mount, a roll restrictor, a driveshaft, a halfshaft, a transmission fluid port, a shifter box, a power transfer unit, a transmission oil cooler, and an electrical harness pigtail. Depending upon the features and functions of a particular powertrain group, many other components may be included in the designations. Sample designations for two hypothetical powertrain groups are shown below.

| Powertrain Group A | |
|---|---|
| Selected Component | Designated Zone |
| Intake Manifold | 2A, 5A, and 8A |
| Exhaust Manifold | 4B, 7B, 9B, 6B, and 3B |
| Turbocharger | 7B, 6B, and 9B |
| Engine Mount | 2B |
| Oil Filter | 4C |
| Throttle Body | 1A |
| Starter | 11B |
| A/C Compressor | 1C |
| Alternator | 1B |
| High Pressure Fuel Pump | 4A |

| Powertrain Group B | |
|---|---|
| Selected Component | Designated Zone |
| Intake Manifold | 1A, 4A, and 7A |
| Exhaust Manifold | 6A |
| Turbocharger | 6B |
| Engine Mount | 2A |
| Oil Filter | 7C |
| Oil Cooler | 7B |
| Throttle Body | 4B |
| Starter | 7B |
| A/C Compressor | 1C |
| Alternator | 1B |
| High Pressure Fuel Pump | 12A |

Figure 12:
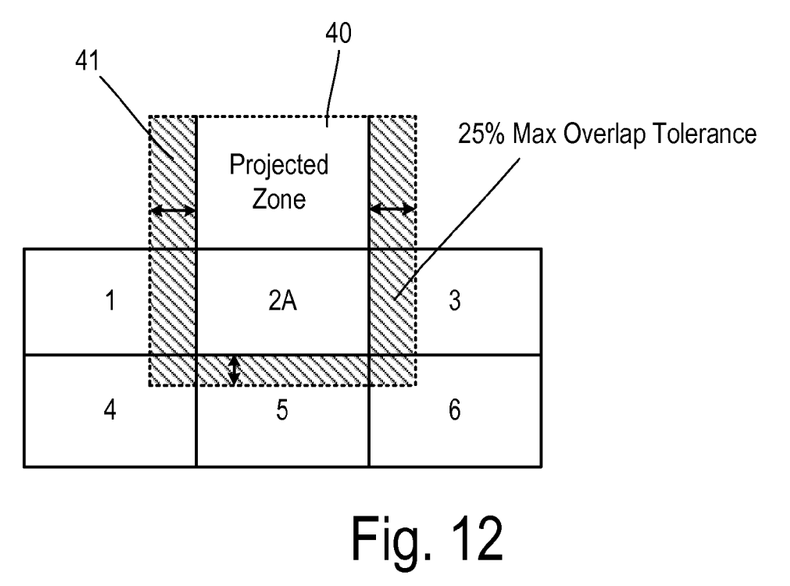
FIG. 12 shows a tolerance margin around a zone projection for constraining the placement of a selected component onto the powertrain.

In the design phase for a particular version of a powertrain within the group, a constraint is placed upon the designers to locate each selected component with a placement within a predetermined tolerance margin of the respective designated zone. As shown in FIG. 12, the predetermined tolerance margin preferably coincides with a maximum overlap into an adjacent zone by an amount equal to 25% of the target zone. Thus, a projected zone 40 is shown corresponding to a grid zone 2A. An incursion into the projections for zones 1 and 3 would be permitted up to 25% of the width of zone 2. Thus, the design constraints are not overly rigid, but still achieve a commonization for the assembly operations, and design standardization, to realize significant cost and quality improvements.

Figure 13:
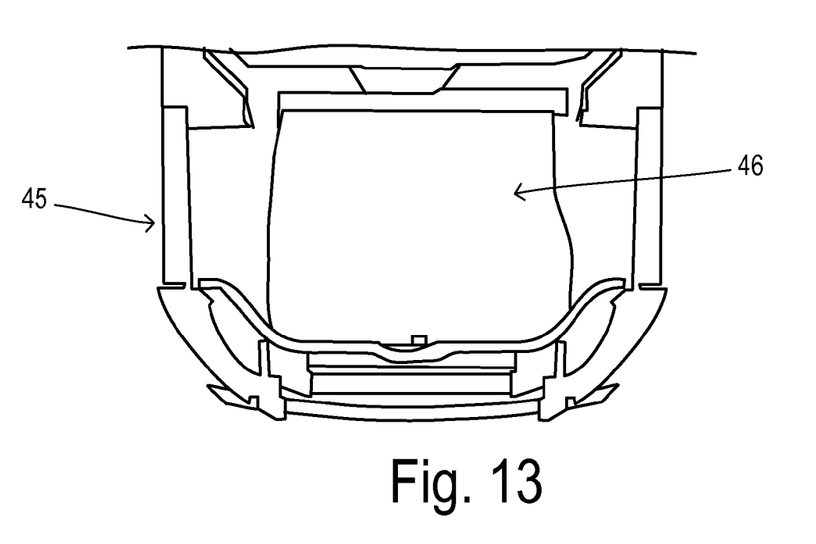
FIG. 13 is a top, plan view of an engine compartment.
Figure 14:
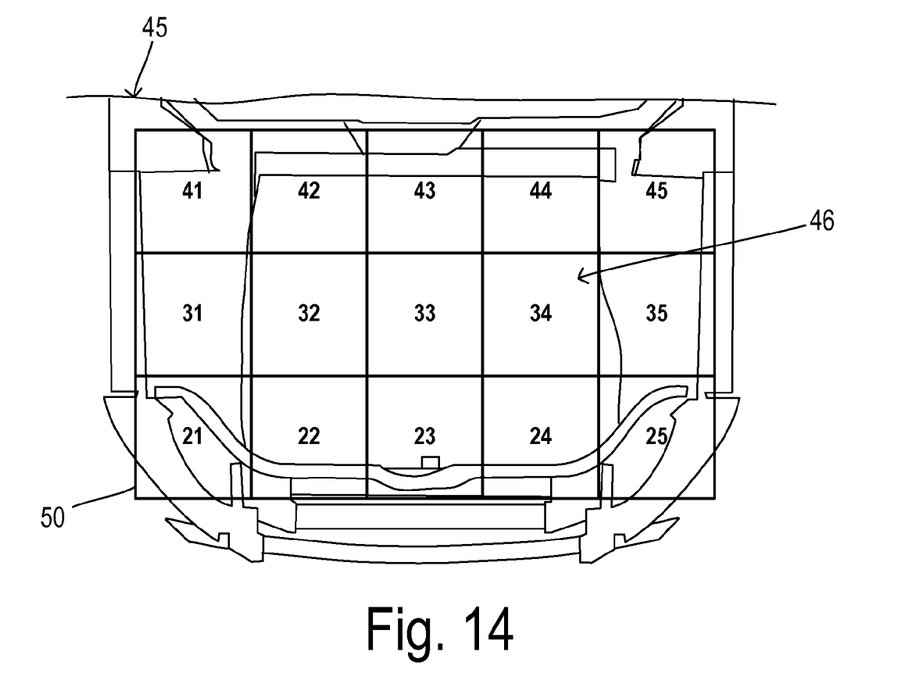
FIG. 14 shows an underhood grid covering an underhood area.

The present invention can further apply a grid organization to placement of components and placement of the powertrain itself within the underhood environment of a vehicle, a vehicle platform, or group of vehicle models. As shown in FIG. 13, a vehicle 45 has an underhood area 46, typically at the front of vehicle 45 and referred to as an engine compartment (although the underhood environment of the invention refers to any area where a powertrain or its interfacing components may be located). As shown in FIG. 14, an underhood grid 50 is defined covering underhood area 46. Underhood grid 50 includes a plurality of underhood zones numbered 21-25, 31-25, and 41-45 which are mapped to underhood space 46 so that it is divided into thirds from front to back (between the radiator and the dash) and into fifths from left to right (between fender liner seams). The underhood zones are preferably of equal size (i.e., height, width and depth). Preferably, they are comprised of three vertical layers (A, B, C) similar to the approach taken on the power plant.

Each vehicle in the vehicle group to which the underhood grid will apply has its own respective vehicle design which employs respective underhood accessories that interface to the powertrain within the underhood environment. These accessories may include an air induction system, steering gear, engine/transmission controller, coolant reservoir, throttle body, air box, radiator, battery, brake booster, and many others. The method of the invention includes designating a respective underhood zone for attaching each of the respective underhood accessories. In other words, during design of a vehicle model, a design constraint would be imposed such that each underhood accessory is located in the target underhood zone within a tolerance margin.

Figure 15:
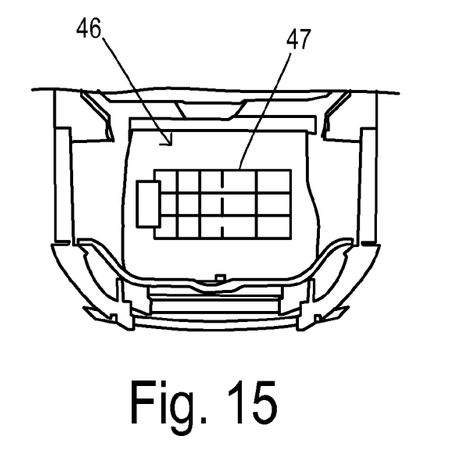
FIG. 15 shows a powertrain grid with an East-West orientation.
Figure 16:
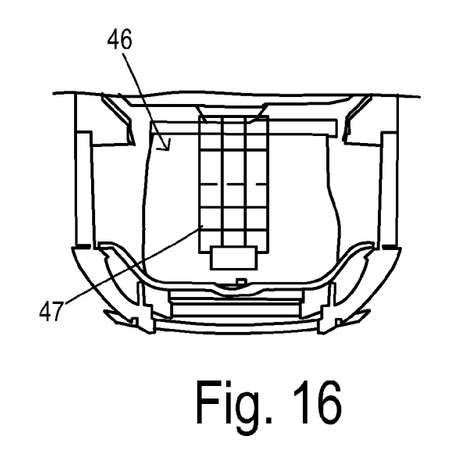
FIG. 16 shows a powertrain grid with a North-South orientation.

In one preferred embodiment, respective underhood zone (s) would also be designated for receiving the three-dimensional grid corresponding to the powertrain group. FIG. 15 shows a powertrain grid 47 placed into underhood space 46 in an East-West orientation, and FIG. 16 shows powertrain grid 47 placed into underhood space 46 in an North-South orientation. When the powertrain grid and the underhood grid are used together, the improvement in manufacturing consistency and simplicity is maximized.

Figure 17:
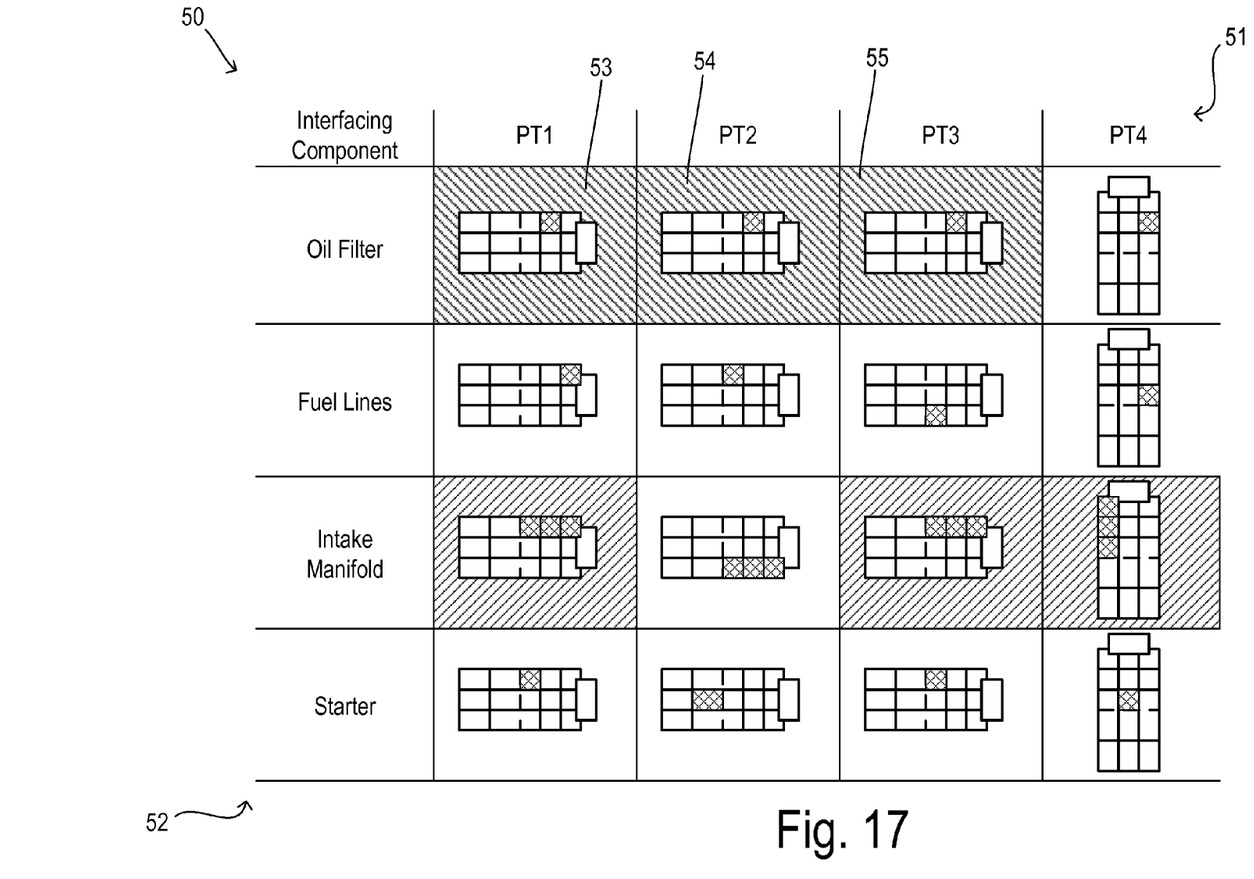
FIG. 17 depicts a storyboard representing the results of compiling design information for a plurality of different powertrain designs.

The grids are also valuable in representing powertrain designs and in discovering and communicating variations between designs. FIG. 17 shows a storyboard 50 which represents the results of compiling design information for a plurality of different powertrain designs. Each column 51 in storyboard 50 represents a different powertrain version. Each row 52 in storyboard 50 represents a different interfacing component. Each cell of storyboard 50 has a powertrain grid which a particular zone being highlighted to show where the corresponding powertrain version locates the corresponding interfacing component. For example, the first row represents the location of an oil filter. Preexisting powertrain versions PT1, PT2, and PT3 each place the oil filter in zone 4, as indicated by a colored shading of zone 4 on each corresponding grid. A powertrain version PT4 instead locates the oil filter in zone 6. Each cell also indicates whether a powertrain is placed in an East-West orientation (as in columns PT1, PT2, and PT3) or in a North-South orientation (as in column PT4).

Storyboard 50 is a tool for studying powertrains, for evaluating an optimum location for designating the placement of selected components, and for benchmarking among powertrain designs. Cells may be shaded according to the most prevalent location for placement of a certain component. For example, cells 53, 54, and 55 are color-coded to highlight the fact that zone 4 is the most popular location for the oil filter. In a storyboard with a large number of different powertrains, additional colors can be used to provide additional resolution (e.g., the second and third most frequently used locations can be represented by respective colors). Once optimum locations are designated for the selected components, an appropriate storyboard is a convenient way to communicate the resulting requirements to designers who are charged with complying with the designated locations.

What is claimed is:

1. A method of manufacturing a vehicle fleet wherein a plurality of vehicle models are built having coordinated designs within a powertrain group, wherein the powertrain group includes a plurality of powertrain versions, each powertrain version including a respective design for a respective power plant and a respective transmission, the method comprising the steps of:

assembling a powertrain of each vehicle within each of the plurality of vehicle models according to a three-dimensional grid corresponding to the powertrain group having a plurality of power plant zones and a plurality of transmission zones, wherein selected components for each powertrain version are attached to each respective powertrain unit within a predetermined tolerance margin of a respective projection defined for the power plant zones and transmission zones, wherein the power plant zones correspond to a first matrix dividing each of a width, length, and height of a respective power plant into a first fixed proportion, and wherein the transmission zones correspond to a second matrix dividing each of a width and height of a respective transmission into the first fixed proportion and a length of the respective transmission into a second fixed proportion;

wherein each respective zone for attaching each of the selected components is common to all the respective power plants and respective transmissions of the powertrain group.

2. The method of claim 1 wherein the first fixed proportion is comprised of thirds and the second fixed proportion is comprised of halves.

3. The method of claim 1 wherein the powertrain group includes a type of internal combustion engines.

4. The method of claim 1 wherein the powertrain group includes a type of electric motors.

5. The method of claim 1 wherein the selected components include an intake manifold, an exhaust manifold, a turbocharger, an engine mount, an oil filter, an oil cooler, an oil fill cap, an oil dipstick, a throttle body, a starter motor, an FEAD pulley, an alternator, an EGR valve, a fuel pump, a vacuum pump, an air induction system, and an electrical harness.

6. The method of claim 1 wherein the selected components include an air-conditioning compressor, a radiator hose coupling, and a heater hose coupling.

7. The method of claim 1 wherein the selected components include a transmission mount, a roll restrictor, a driveshaft, a halfshaft, a transmission fluid port, a shifter box, a power transfer unit, a transmission oil cooler, and an electrical harness.

8. The method of claim 1 wherein the predetermined tolerance margin is comprised of a twenty five percent maximum overlap onto an adjacent zone.

9. The method of claim 1 wherein a power plant for a respective powertrain version is comprised of an internal combustion engine, wherein the internal combustion engine includes a front-end accessory drive with a pulley, and wherein the first matrix has a front edge coinciding with a rear face of the pulley.

10. The method of claim 9 wherein the internal combustion engine includes an engine block, and wherein the first matrix has a back edge coinciding with a rear face of the engine block.

11. The method of claim 1 wherein a power plant for a respective powertrain version is comprised of a V-engine, wherein the V-engine includes a valve cover, and wherein the first matrix has a side edge coinciding with an outermost edge of the valve cover.

12. The method of claim 1 wherein a power plant for a respective powertrain version is comprised of an in-line engine, wherein the in-line engine includes a block/head interface, and wherein the first matrix has a width equal to twice a maximum width of the block/head interface.

13. The method of claim 1 wherein the second matrix is assigned a width equal to a width of the first matrix regardless of an actual width of the respective transmission.

14. The method of claim 1 wherein a powertrain version includes a transfer case, wherein the three-dimensional grid includes a transfer-case zone corresponding to a third matrix dividing each of a width and height of the transfer case into thirds and a length of the transfer case being undivided.

15. The method of claim 1 further comprising the steps of:
installing each assembled powertrain into the respective vehicle according to an underhood grid associated with a respective vehicle group for the respective powertrain versions, wherein the underhood grid includes a plurality of underhood zones mapped to an underhood space of each vehicle model in the vehicle group, wherein the assembled powertrain is placed so that the three-dimensional grid corresponding to the powertrain group is received according to the respective underhood zones, and wherein the vehicle group includes respective vehicle designs employing respective underhood accessories; and
attaching each of the respective underhood accessories according to the respective underhood zones.

16. The method of claim 15 wherein the vehicle group corresponds to a vehicle platform.

17. A vehicle fleet comprising:
a plurality of assembled vehicles built according to a plurality of predetermined vehicle models with coordinated powertrain designs within respective powertrain groups, wherein each powertrain group includes a plurality of powertrain versions, each powertrain version including a respective design for a respective power plant and a respective transmission;
wherein each assembled vehicle comprises a respective powertrain unit configured according to a three-dimensional grid corresponding to the respective powertrain group having in common for all vehicle models within the powertrain group a plurality of power plant zones and a plurality of transmission zones, wherein each respective powertrain unit is comprised of selected components for each powertrain version which are attached to the respective powertrain unit within a predetermined tolerance margin of a respective projection defined for the power plant zones and transmission zones, wherein the power plant zones correspond to a first matrix dividing each of a width, length, and height of a respective power plant into a first fixed proportion, and wherein the transmission zones correspond to a second matrix dividing each of a width and height of a respective transmission into the first fixed proportion and a length of the respective transmission into a second fixed proportion.

18. The vehicle fleet of claim 17 wherein each powertrain unit of each assembled vehicle is placed into the respective vehicle so that the three-dimensional grid corresponding to its powertrain group conforms to an underhood grid associated with a respective vehicle group for the respective powertrain versions, wherein the underhood grid includes a plurality of underhood zones mapped to an underhood space of each vehicle model in the vehicle groups.

19. The vehicle fleet of claim 18 wherein each assembled vehicle is further comprised of a plurality of underhood accessories, wherein each underhood accessory is placed according to respective underhood zones in common for all vehicle models for each respective underhood grid for the respective vehicle groups.

* * * * *